United States Patent [19]
Nishi

[11] Patent Number: 5,634,231
[45] Date of Patent: Jun. 3, 1997

[54] SEMICONDUCTOR MANUFACTURING APPARATUS

[75] Inventor: Kenji Nishi, Yokohama, Japan

[73] Assignee: Nikon Corporation, Tokyo, Japan

[21] Appl. No.: 434,056

[22] Filed: May 3, 1995

[30] Foreign Application Priority Data

May 13, 1994 [JP] Japan ................................. 6-099933

[51] Int. Cl.$^6$ ................ H01L 21/027; H01L 21/304; B08B 11/02
[52] U.S. Cl. .................... 15/102; 15/1.51; 15/77; 15/97.1; 15/309.2; 134/902; 451/289; 451/388
[58] Field of Search ................ 15/1.51, 306.1, 15/309.2, 97.1, 102, 21.1, 77, 88.1; 134/153, 902; 451/289, 388

[56] References Cited

U.S. PATENT DOCUMENTS

| 4,473,922 | 10/1984 | Weihe | 15/309.2 |
| 4,811,443 | 3/1989 | Nishizawa | 15/97.1 |
| 5,144,711 | 9/1992 | Gill, Jr. | 15/97.1 |
| 5,351,360 | 10/1994 | Suzuki et al. | 15/97.1 |
| 5,361,449 | 11/1994 | Akimoto | 15/309.2 |
| 5,375,291 | 12/1994 | Tateyama et al. | 15/309.2 |

FOREIGN PATENT DOCUMENTS

| 62-166515 | 7/1987 | Japan | 134/902 |
| 62-188323 | 8/1987 | Japan | 134/902 |
| 1563789 | 5/1990 | U.S.S.R. | 134/902 |

*Primary Examiner*—Mark Spisich
*Attorney, Agent, or Firm*—Shapiro and Shapiro

[57] ABSTRACT

An apparatus for exposing a substrate chucked on a substrate holder includes a substrate stocking device for stocking a plurality of substrates, a substrate conveying system for picking up the substrate from the substrate stocking device and conveying the substrate to the substrate, holder while chucking a portion of a rear surface of the substrate and a cleaning system for cleaning the rear surface of the substrate.

17 Claims, 5 Drawing Sheets

SEMICONDUCTOR MANUFACTURING APPARATUS

BACKGROUND OF THE INVENTION

1. Field of the Invention

The present invention relates to a semiconductor manufacturing apparatus and method for manufacturing semiconductor elements, display elements, and the like and, more particularly, to a semiconductor manufacturing apparatus which comprises a mechanism for automatically cleaning foreign matter attached to the rear surface of a wafer, and a semiconductor manufacturing method.

2. Related Background Art

A conventional exposure apparatus used in the manufacture of semiconductor elements, liquid crystal display elements, and the like has a substrate stage, and a substrate holder which is placed on the substrate stage and holds a photosensitive substrate (a wafer, glass substrate, or the like). The substrate holder has a vacuum chuck groove on its surface so as to immovably hold a substrate upon transfer of a pattern image on a mask onto the substrate. By reducing the pressure in the gap between the vacuum (reduced pressure) chuck groove on the substrate holder surface and the substrate, the substrate holder chucks or holds the rear surface of the substrate by vacuum suction.

Upon reduction of the pressure (vacuum suction) when the substrate holder chucks the substrate, if foreign matter (a fine particle as small as about 1 μm) becomes attached to the rear surface of the substrate, the flatness of the exposure surface (front surface) of the substrate is impaired due to the influence of the foreign matter. The impaired flatness of the exposure surface causes a displacement error or a focus error in each shot area on the substrate, and seriously deteriorates the yield in the manufacturing processes of semiconductor elements and liquid crystal displays.

Conventionally, in order to prevent attachment of foreign matter, the rear surface of the substrate is washed in a pre-process, or the ratio of the contact area between the substrate holder and the substrate to the entire area of the substrate, i.e., the contact area ratio is reduced to about 6 to 7%.

However, in order to meet recent requirements for miniaturizing exposure patterns, the N.A. (numerical aperture) of an optical system (projection optical system) for transferring a pattern on a mask onto a substrate has increased, and the focal depth of the projection optical system has become increasingly small.

As the pattern is miniaturized, the allowable value of the displacement error also becomes small. Therefore, the allowable value of the size of foreign matter attached to the rear surface of the substrate becomes small upon miniaturization of exposure patterns.

Even when the rear surface of a substrate is washed in the pre-process, dust may be raised upon contact between a holding arm or the like of a conveying device and the rear surface of a wafer 1 during the conveyance of the substrate onto the substrate holder in the exposure apparatus, and foreign matter may become attached to the substrate.

The contact region of the rear surface of a wafer in the conventional exposure apparatus, and the influence of attached foreign matter will be explained below with reference to FIGS. 6A and 6B.

FIG. 6A shows a contact surface shape between a conventional wafer holder 2 and a wafer 1.

The wafer holder 2 has a plurality of contact regions contacting the wafer 1. The contact regions include a plurality of annular regions.

More specifically, the wafer holder 2 contacts the wafer 1 via contact regions (circular contact regions) 52 to 57 (solid circle regions in FIG. 6A) in FIG. 6A.

By reducing the pressures in the gaps defined between the wafer 1 and a region between the contact regions 52 and 53, a region between the contact regions 54 and 55, and a region between the contact regions 56 and 57, the wafer 1 is vacuum-chucked to the wafer holder 2.

Although the wafer 1 is not vacuum-chucked to the wafer holder 2 in other regions, grooves (e.g., between the contact regions 53 and 54) are formed on such regions to reduce the contact area between the wafer 1 and the wafer holder 2.

For example, as shown in FIG. 6B, when foreign matter (foreign matter 58 in FIG. 6B) is attached between the contact regions of the wafer 1 and the wafer holder 2, the flatness of the wafer 1 is impaired. On the other hand, when foreign matter (foreign matter 59 in FIG. 6B) is attached between regions where the wafer 1 and the wafer holder 2 do not contact, it does not influence the flatness of the wafer 1.

SUMMARY OF THE INVENTION

It is, therefore, an object of the present invention to provide an apparatus and method, which can clean foreign matter attached to a given region of the rear surface of a substrate, which region contacts the substrate holder so as to eliminate the influence on the flatness of the substrate.

According to the present invention, an apparatus for exposing a substrate chucked on a substrate holder, comprises:

a substrate stocking device for stocking a plurality of substrates; a substrate conveying system for picking up a substrate from the substrate stocking device, and conveying the substrate to a substrate holder while chucking a portion of the rear surface of the substrate; and a cleaning system for cleaning the rear surface of the substrate.

DESCRIPTION OF THE PREFERRED EMBODIMENTS

Figure 1:
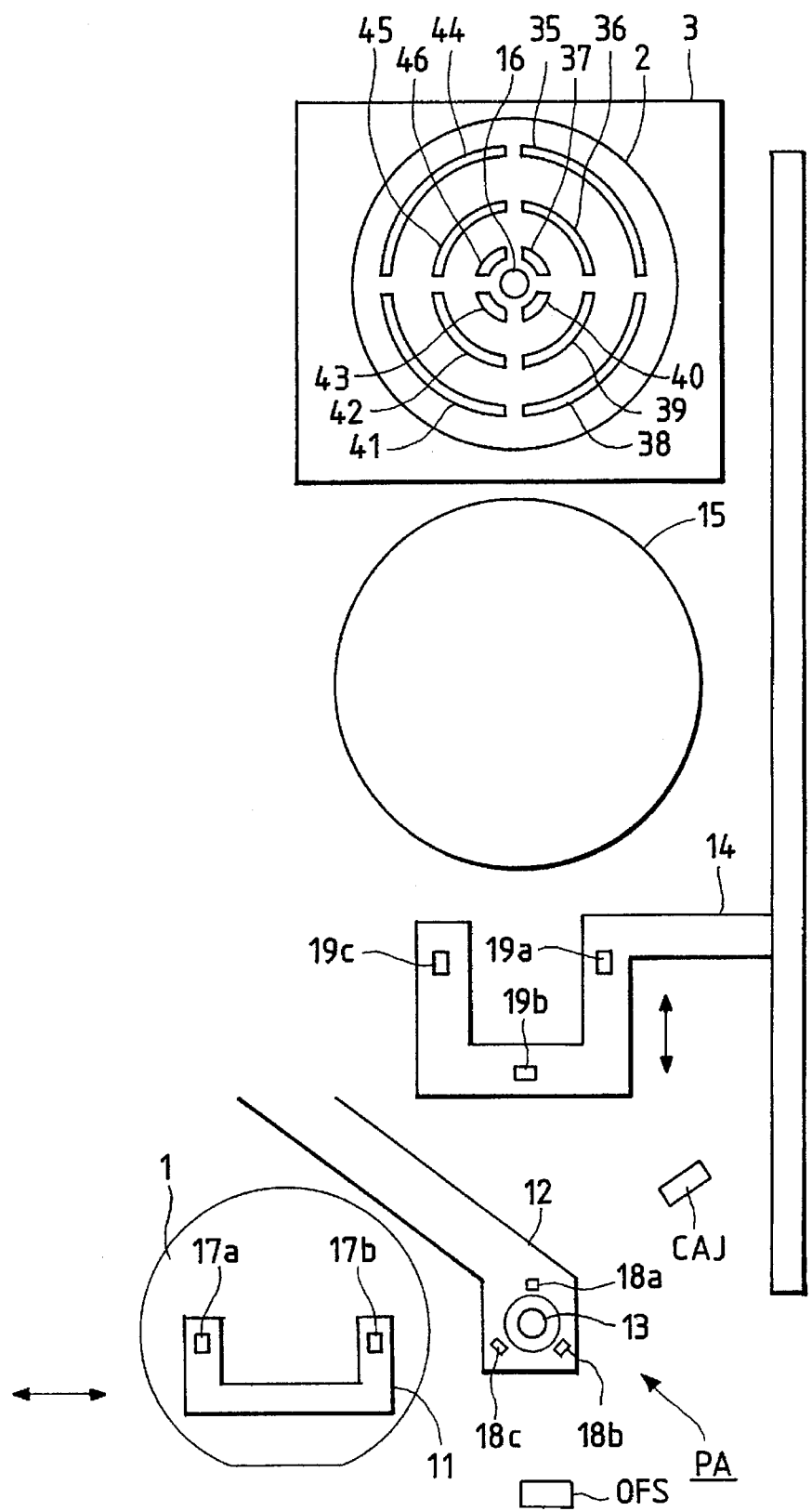
FIG. 1 is a view showing the arrangement of an exposure apparatus according to a first embodiment of the present invention.

FIG. 1 schematically shows an apparatus according to an embodiment of the present invention. FIG. 1 is a schematic view showing the arrangement of an apparatus which conveys a wafer, cleans the rear surface of the wafer, and conveys the wafer to a wafer holder on a wafer stage.

A wafer 1 conveyed from a wafer stocking unit (not shown) by a horizontal slider arm 11 is transferred to a wafer rotating mechanism 13 of a wafer pre-alignment unit PA via a transfer arm 12.

Furthermore, the wafer pre-alignment unit PA matches the center of the wafer with the center of rotation of the wafer rotating mechanism 13 using a wafer centering mechanism CAJ.

The wafer pre-alignment unit PA rotates the chucked wafer 1 using the wafer rotating mechanism 13, and detects the orientation flat (OF) of the wafer 1 using an OF detection sensor OFS to align the wafer 1 in a predetermined direction.

The transfer arm 12 receives the wafer 1 from the wafer rotating mechanism 13, and transfers it to a wafer loading/unloading arm 14. The wafer loading/unloading arm 14 conveys the wafer 1 to a wafer holder 2 on a wafer stage 3. The rear surface of the wafer 1 contacts and is chucked (held by vacuum suction) by chuck portions 17a and 17b of the horizontal slider arm 11, chuck portions 18a to 18c of the transfer arm 12, and chuck portions 19a to 19c of the wafer loading/unloading arm 14. More specifically, the horizontal slider arm 11, the transfer arm 12, and the wafer loading/unloading arm 14 chuck hold (by vacuum suction) the rear surface of the wafer 1, and convey the wafer 1.

A wafer cleaning device 15 (to be described in detail later) for cleaning the rear surface of the wafer 1 is inserted in the conveying path of the wafer loading/unloading arm 14 between the wafer pre-alignment unit PA and the wafer stage 3. The wafer 1 transferred to the wafer loading/unloading arm 14 is transferred to the wafer cleaning device 15. The rear surface of the wafer 1 is cleaned by the wafer cleaning device 15 (as will be described in detail later), and thereafter, the wafer 1 is transferred to the wafer loading/unloading arm 14 again. Then, the wafer 1 is transferred to the wafer holder 2.

A center up 16, which moves vertically to transfer a wafer, is arranged at the central portion of the wafer holder 2. The wafer 1 is transferred between the wafer holder 2 and the wafer loading/unloading arm 14 via the center up 16. The wafer holder 2 on which the wafer 1 is placed constitutes a portion of the exposure apparatus for exposing a pattern or the like on a mask onto the wafer 1.

Figure 2:
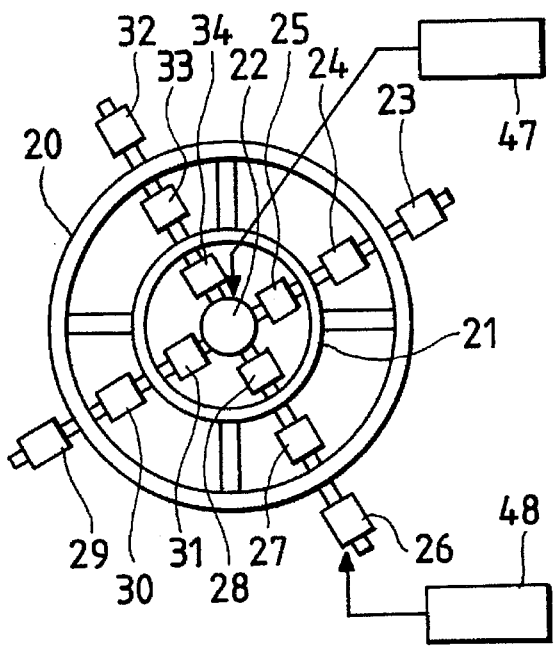
FIG. 2 is a plan view showing the arrangement of a cleaning portion according to a first embodiment of the present invention.

The arrangement of the wafer cleaning device 15 will be described below with reference to FIG. 2. FIG. 2 is a plan view of the wafer cleaning device.

The wafer cleaning device 15 is constituted by wafer chuck portions 20 and 21 for chucking the wafer 1, cleaning portions 23 to 34 which are vertically movable by a cleaning portion driving device 48, and a transfer mechanism 22 for transferring the wafer from the wafer loading/unloading arm 14 to the wafer chuck portions 20 and 21.

The transfer mechanism 22 is arranged at the central portion of the wafer cleaning device 15, and is vertically moved by a vertical driving device 47.

The chuck portions 20 and 21 chuck the wafer 1, and the cleaning portions 23 to 34, which are vertically movable, are brought into contact with the wafer 1. When the cleaning portions 23 to 34 are rotated (e.g., through 90°), the rear surface of the wafer is cleaned. The vertical movement and rotation of the cleaning portions are attained by the cleaning portion driving device 48.

Note that each of the cleaning portions 23 to 34 comprises a grindstone or dust-free cloth. The cleaning portions 23 to 34 are joined to a rotating shaft 51 via springs 50, so that they can uniformly contact the rear surface of a wafer at a proper pressure.

Figure 4:
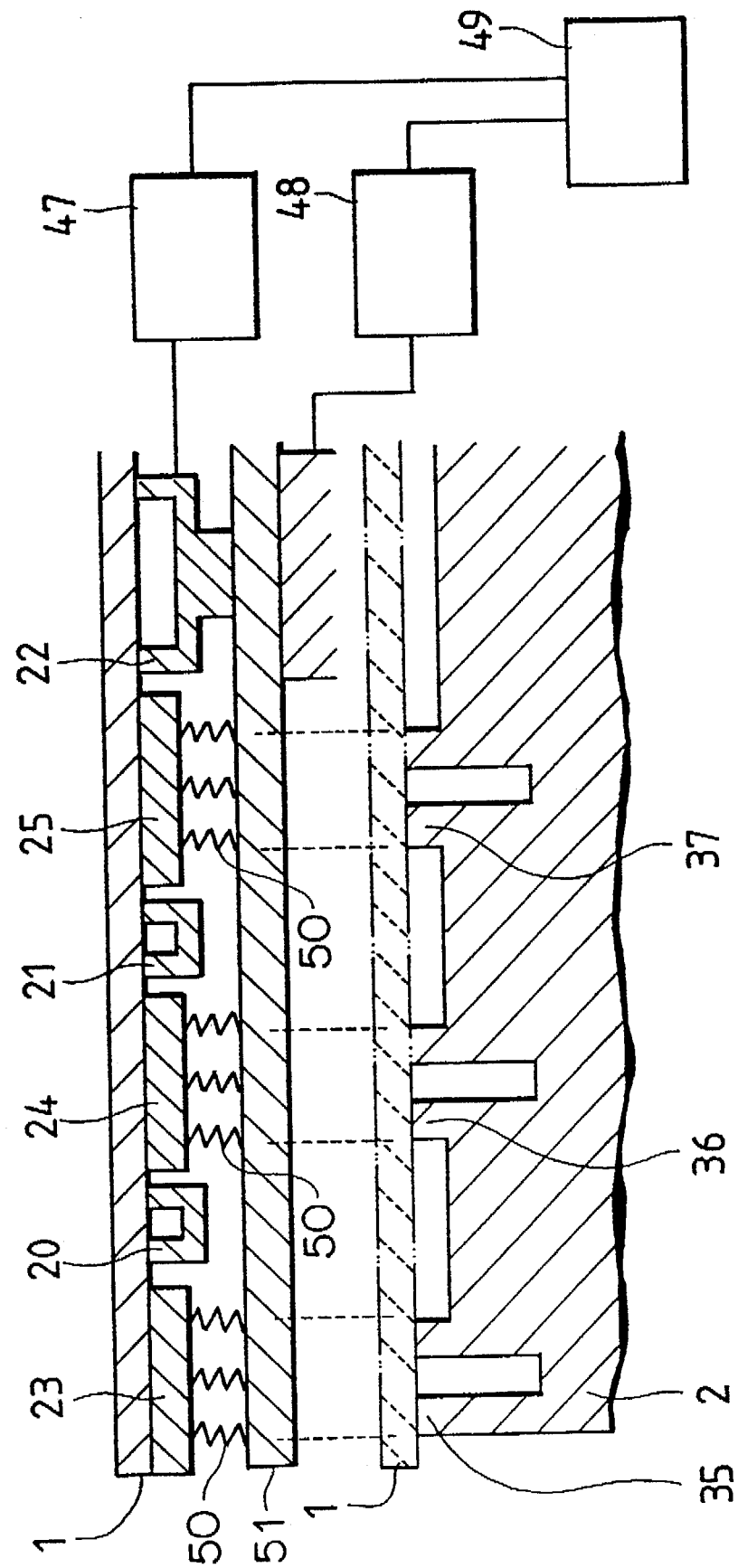
FIG. 4 is a sectional view showing the relationship between a wafer contact region of the cleaning portion and a wafer contact region of the wafer holder in the first embodiment of the present invention.

The vacuum chucking of the wafer chuck portions 20 and 21, the vertical movement of the transfer mechanism 22, and the vertical movement and rotation of the cleaning portions 23 to 34 are controlled by a wafer rear surface cleaning controller 49 (FIG. 4).

Figure 3:
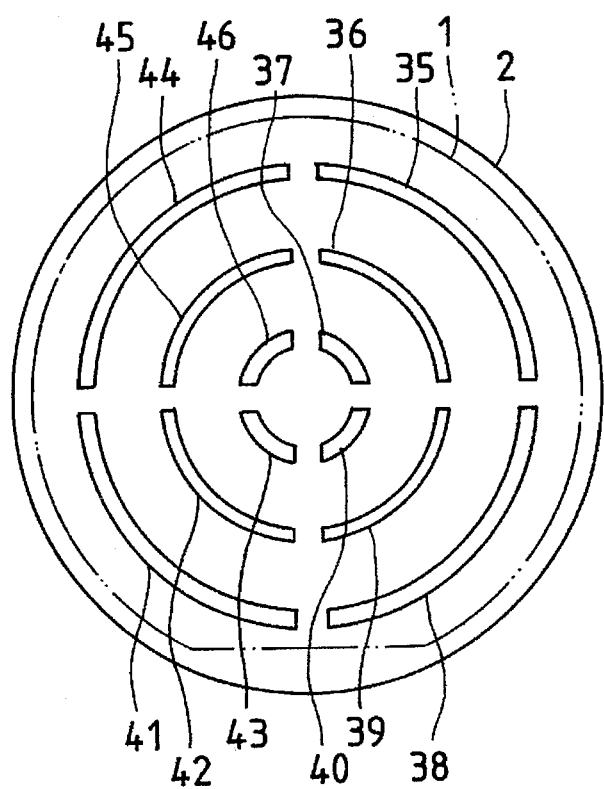
FIG. 3 is a view showing the shape of a wafer holder suitably used in the first embodiment of the present invention.

The contact surface shape of the wafer holder 2 in this embodiment will be described below with reference to FIG. 3.

Figure 6A:
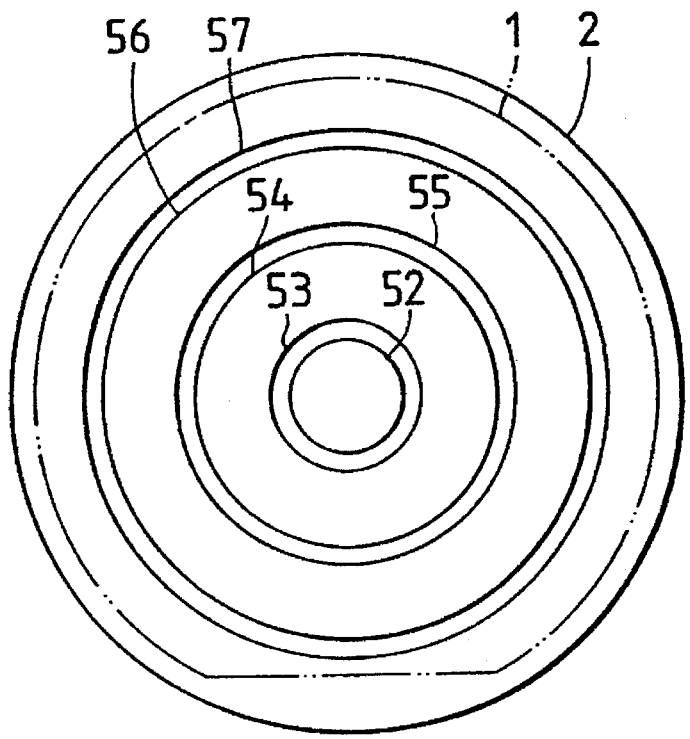
FIG. 6A is a view showing a conventional wafer holder shape.

Each of contact regions (e.g., 35, 38, 41, and 44) of the wafer holder 2 has a shape obtained by dividing concentric contact regions (e.g., contact regions 56 and 57 in FIG. 6A) into four sections. More specifically, each of the contact regions 35, 38, 41, and 44 has a shape obtained by dividing the contact regions 56 and 57 in FIG. 6A into four sections, and closing each of the divided sections to define a contact region. Each of contact regions 36, 39, 42, and 45 has a shape obtained by dividing the contact regions 54 and 55 in FIG. 6A into four sections, and closing each of the divided sections to define a contact region. Each of contact regions 37, 40, 43, and 46 has a shape obtained by dividing the contact regions 52 and 53 in FIG. 6A into four sections, and closing each of the divided sections to define a contact region. By reducing the pressure in (evacuating) the gap defined between a portion surrounded by the contact regions 35 to 46 and the wafer 1, the wafer 1 is chucked to the wafer holder 2. As shown in FIG. 3, each contact region has a non-contact region (a region where no contact occurs) in the circumferential direction. Since foreign matter may become attached to the wafer 1 at the rotation start and stop positions of the cleaning portions 23 to 34, the wafer holder 2 has a contact surface shape shown in FIG. 3 (a contact surface shape in which non-contact regions are formed in the circumferential direction). More specifically, the shapes of the contact regions on the wafer holder 2 are determined to be smaller than regions on the wafer which correspond to the cleaning portions 23 to 34 (in other words, the contact surface shape of the wafer holder 2 is determined so that the non-contact regions on the wafer holder 2 include contact regions between the wafer 1 and the cleaning portions 23 to 34 when the rotation of the cleaning portions 23 to 34 stops). With this holder shape, when the wafer 1 is placed on the wafer holder 2, no foreign matter enters between the wafer holder 2 and the wafer 1. Also, the positions and sizes of contact surfaces, in the radial direction, of the wafer holder 2 are determined, so that the contact regions (35 to 46) of the wafer holder 2 chuck the regions cleaned by the wafer cleaning device 15 on the wafer 1. More specifically, the distance from the center of rotation (the position of the transfer mechanism 22) of the cleaning portions 23 to 34 to the cleaning portion 23 (26, 29, or 32) is substantially equal to the distance from the center of the wafer holder 2 to each of the contact regions 35, 38, 41, and 44. Similarly, the distance from the center of rotation of the cleaning portions to the cleaning portion 24 (27, 30, or 33) is substantially equal to the distance from the center of the wafer holder 2 to each of the contact regions 36, 39, 42, and 45, and the distance from the center of rotation of the cleaning portions to the cleaning portion 25 (28, 31, or 34) is substantially equal to the distance from the center of the wafer holder 2 to each of the contact regions 37, 40, 43, and 46. Also, the position of the wafer loading/unloading arm 14 with respect to the position of the pre-alignment unit PA, the positions of the chuck portions 19a to 19c on the wafer loading/unloading arm 14, the positions of the wafer loading/unloading arm 14 and the wafer holder 2 are determined so that the contact positions between the chuck portions 19a to 19c and the wafer 1 are different from those of the contact regions (35 to 46) of the wafer holder 2.

The cleaning operation of the wafer cleaning device 15 will be described in detail below. The wafer loading/unloading arm 14, which holds the wafer 1, moves from the pre-alignment unit PA to the wafer cleaning device 15. The wafer loading/unloading arm 14 stops at a position above the wafer cleaning device 15, and the transfer mechanism 22 is vertically moved by the vertical driving device 47 to transfer the wafer 1 to the transfer mechanism 22. After the wafer loading/unloading arm 14 is retracted in a direction of the pre-alignment unit, the transfer mechanism 22 moves downward, and the wafer 1 is placed on and vacuum-chucked by the wafer chuck portions 20 and 21. Thus, the wafer 1 is fixed on the wafer chuck portions 20 and 21 (wafer cleaning device 15). Thereafter, the cleaning portions 23 to 34 move upward, contact the rear surface of the wafer 1, and are rotated through 90°. With this operation, foreign matter on the contact regions (that is, regions that will contact the wafer holder) on the rear surface of the wafer is removed. After the cleaning operation, the cleaning portions 23 to 34 move downward, and the transfer mechanism 22 moves upward. Thus, the wafer 1 is separated from the wafer chuck portions 20 and 21. Thereafter, the transfer mechanism 22 moves downward, and the wafer 1 is transferred onto the wafer loading/unloading arm 14 which is inserted below the wafer 1. The wafer loading/unloading arm 14, which holds the wafer 1, moves to a position above the wafer holder 2. Thereafter, the center up 16 moves upward to receive the wafer 1. After the wafer loading/unloading arm 14 is retracted in the direction of the pre-alignment unit, the center up 16 moves downward to place the wafer 1 on the wafer holder 2. The wafer 1 is vacuum-chucked to be fixed on the wafer holder 2. Thereafter, an exposure operation is started.

Figure 6B:
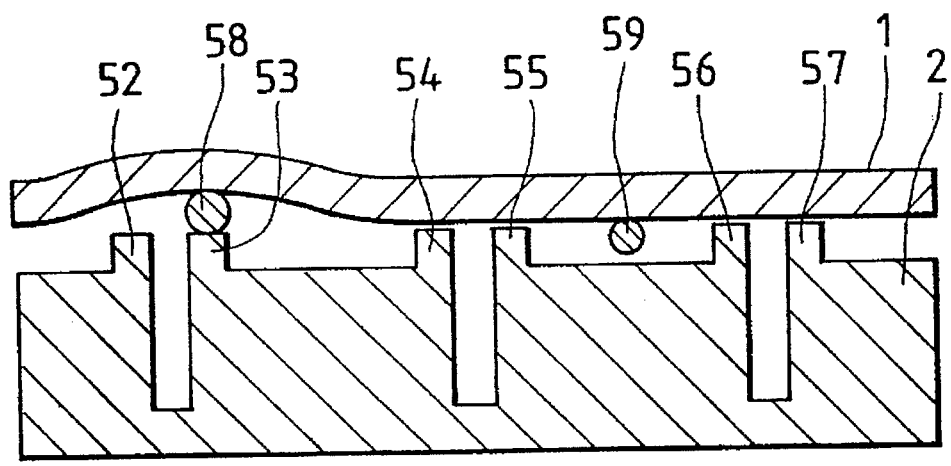
FIG. 6B is a view showing the influence of foreign matter when a wafer is placed on a wafer holder.

FIG. 4 is a sectional view showing the relationship between the contact regions between the wafer 1 and the cleaning device 15, and the contact regions between the wafer 1 and the wafer holder 2. As can be seen from FIG. 4, the wafer cleaning device 15 cleans the regions of the rear surface of the wafer 1 that contact the wafer holder 2. Even when foreign matter is attached to regions other than these regions, it does not influence the flatness of the wafer, like the foreign matter 59 in FIG. 6B.

As described above, the contact regions (the positions of the chuck portions 19a to 19c) between the wafer loading/unloading arm 14 and the wafer 1 upon transfer of the wafer 1 from the wafer cleaning device 15 to the wafer holder 2 are set to be different from those between the wafer holder 2 and the wafer 1. This is to prevent dust on the contact regions between the wafer loading/unloading arm 14 and wafer 1 from influencing the flatness of the wafer 1 when the wafer 1 is placed on the wafer holder 2.

The regions to be cleaned have a given margin (the regions to be cleaned are set to be larger than the contact regions), so that the contact regions between the wafer 1 and the wafer holder 2 when the wafer 1 is placed on the wafer holder 2 are cleaned regions, even when the wafer 1 is displaced during transfer from the wafer cleaning device 15 to the wafer holder 2.

Figure 5:
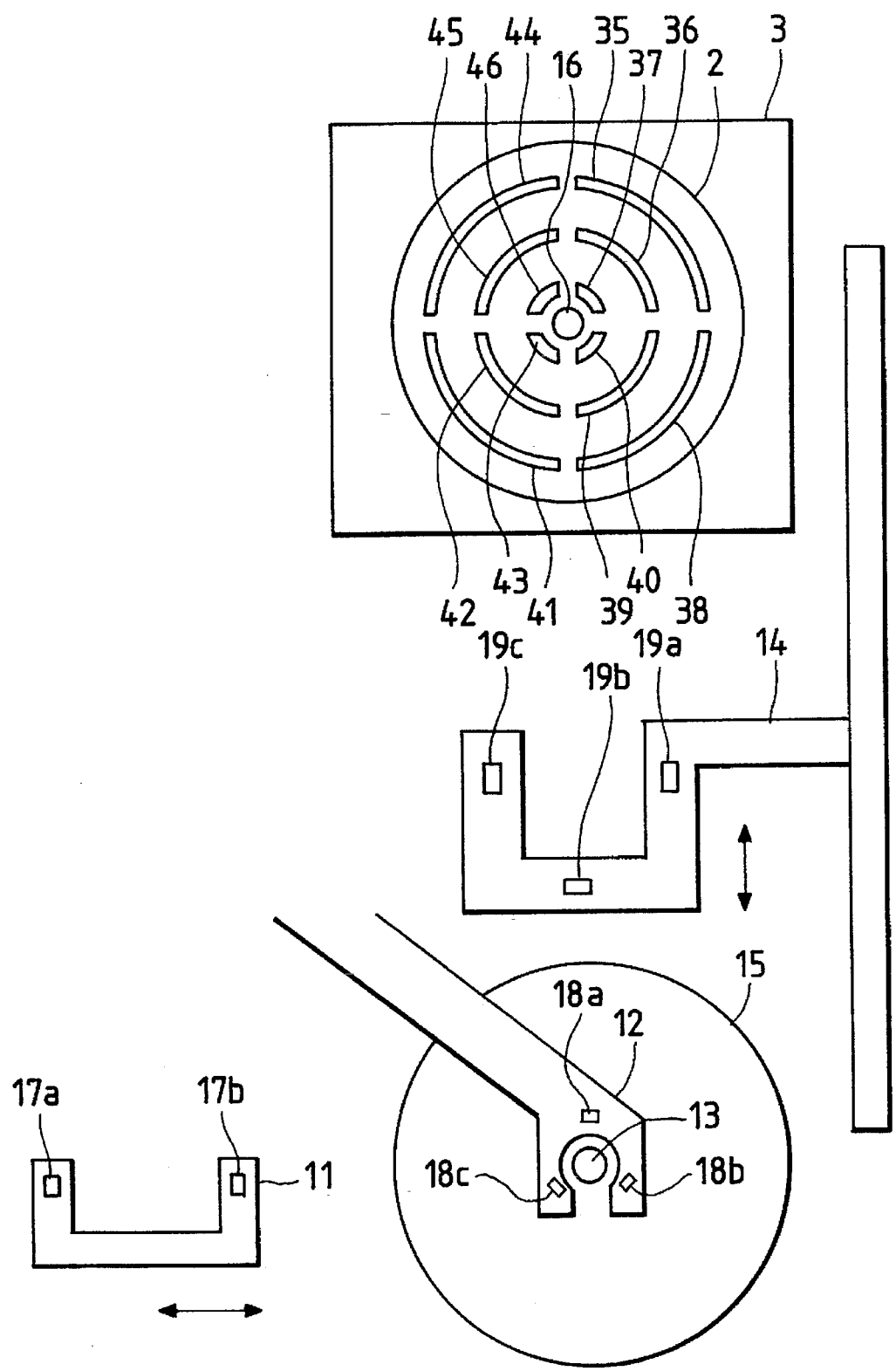
FIG. 5 is a view showing the arrangement of an exposure apparatus according to each of second and third embodiments of the present invention.

The second embodiment of the present invention will be described below. The wafer cleaning device 15 of this embodiment is arranged on the pre-alignment unit, as shown in FIG. 5. In this case, the transfer mechanism 22 shown in FIG. 2 corresponds to the wafer rotating mechanism 13 in FIG. 1, and transfer operations to the horizontal slider arm 11 and the wafer loading/unloading arm 14 are attained by the transfer arm 12. In this case, the transfer arm 12 is retractable in the operating direction of the wafer loading/unloading arm 14 so as not to disturb the operation of the wafer cleaning device 15.

The cleaning operation in this embodiment is performed as follows. The wafer 1 is transferred from the horizontal slider arm 11 to the transfer arm 12, and is placed on the wafer rotating mechanism 13. In this operation, the transfer arm 12 is retracted in the operating direction of the wafer loading/unloading arm 14. After the center of the wafer is detected, the wafer is rotated to detect the orientation flat of the wafer 1. Thereafter, the wafer chuck portions 20 and 21 move upward to vacuum-chuck and fix the wafer 1, and the cleaning portions 23 to 34 move upward to contact the wafer 1. The cleaning portions 23 to 34 are rotated through 90° to clean the rear surface of the wafer 1. After the cleaning operation, the cleaning portions 23 to 34 and the wafer chuck portions 20 and 21 move downward, and the transfer arm 12 is inserted below the wafer 1 again. The wafer 1 is transferred to the wafer loading/unloading arm 14 by the transfer arm 12, and is then conveyed to the wafer holder 2.

In the second embodiment, the regions to be cleaned by the wafer cleaning device 15 preferably have a given margin to be sufficiently larger than the regions of the rear surface of the wafer 1 that contact the wafer holder 2, as in the first embodiment.

On the other hand, the contact regions between the wafer loading/unloading arm 14 and the wafer 1 are determined so that the wafer 1 placed on the wafer holder 2 is not influenced by dust on the contact regions between the wafer loading/unloading arm 14 and the rear surface of the wafer 1, as in the first embodiment.

In the first and second embodiments, the cleaning operation is attained by rotating the cleaning portions 23 to 34. Alternatively, the cleaning portions 23 to 34 may be fixed in position, and the wafer 1 may be rotated to clean its rear surface.

The third embodiment of the present invention will be described below. In this embodiment as well, the wafer cleaning device 15 is arranged on the pre-alignment unit as in the second embodiment. In the arrangement of the wafer cleaning device 15, the wafer chuck portions 20 and 21 are omitted from the arrangement of the second embodiment, and the function of chucking the wafer 1 in a wafer cleaning operation is performed by the wafer rotating mechanism 13. The cleaning portions 23 to 34 are not rotated but fixed in position, and are brought into contact with the rear surface of the wafer 1 during rotation of the wafer rotating mechanism 13, thus attaining a cleaning operation.

The operation of the wafer cleaning device 15 in this embodiment will be described below. The wafer 1 is transferred from the transfer arm 12 to the wafer rotating mechanism 13, and is vacuum-chucked by the wafer rotating mechanism 13. The transfer arm 12 is retracted in the operating direction of the wafer loading/unloading arm 14. Thereafter, the cleaning portions 23 to 34 move upward and are brought into contact with the rear surface of the wafer 1. The wafer 1 begins to be rotated by the wafer rotating mechanism 13 to detect its orientation flat. During rotation, since the cleaning portions 23 to 34 contact the rear surface of the wafer 1, the rear surface of the wafer 1 can be cleaned simultaneously with detection of the orientation flat of the wafer 1. After the cleaning operation of the rear surface of the wafer 1 and the detection operation of the orientation flat are completed, and the orientation flat position is set at a predetermined position, the wafer 1 is conveyed to the wafer holder 2 via the transfer arm 12 and the wafer loading/unloading arm 14.

In this case, since the orientation flat position of the wafer 1 is detected by rotating the wafer 1, and the orientation flat position of the wafer 1 is stopped at a predetermined position, foreign matter attached to the cleaning portions 23 to 34 may be re-attached to the rear surface of the wafer 1 at this stop position. The relationship between the positions of the cleaning portions 23 to 34 when the rotation of the wafer stops and the positions of the contact regions on the wafer holder 2 is preferably set to prevent foreign matter from being inserted between the rear surface of the wafer and the holder contact surface due to the influence of re-attachment of foreign matter when the wafer 1 is placed on the wafer holder 2.

In each of the above-mentioned three embodiments, the cleaning operation is attained by bringing a grindstone or dust-free cloth to the rear surface of the wafer 1. Alternatively, a method of blowing out foreign matter on the rear surface of the wafer 1 by air shower, a method of electrostatically attracting foreign matter attached to the rear surface of the wafer, and the like are available. Also, the method of cleaning the rear surface of the wafer in a contact state, and the method of cleaning the rear surface by clean air shower may be appropriately combined.

In each of the above-mentioned three embodiments, a wafer holder cleaning device for cleaning the surface of the wafer holder 2 may be arranged to remove foreign matter attached on the wafer holder 2, thereby further improving the flatness of the wafer 1. This device has a structure retractable from a position above the wafer holder 2, and each of contact portions with the surface of the wafer holder 2 is provided with a cleaning tool such as a grindstone or dust-free cloth. The wafer holder cleaning device is controlled to clean the wafer holder 2 every time an exposure operation for a predetermined number of wafers or all the wafers in a lot is completed.

The present invention may be similarly applied to an exposure apparatus which manufactures liquid crystal display elements and the like by exposing a mark pattern on a reticle onto a rectangular glass plate on the surface of which a resist layer is formed. In this case, the rear surface of the glass plate may be cleaned.

The present invention is not limited to the above-mentioned embodiments, and various changes and modifications may be made without departing from the spirit and scope of the invention.

According to the above-mentioned apparatus, since cleaning means cleans the rear surface of a photosensitive substrate before the photosensitive substrate is placed on a substrate holder, the flatness of the photosensitive substrate can be prevented from being influenced by foreign matter when the photosensitive substrate is placed on the substrate holder.

What is claimed is:

1. A substrate cleaning system including a cleaning device which cleans a substrate, a substrate holding device having a first holding portion for holding said substrate and a groove portion that does not contact said substrate, and a carrying device which transfers said substrate from said cleaning device to said substrate holding device, said substrate cleaning system comprising:

a cleaning portion provided in said cleaning device, which cleans a portion of a surface of said substrate corresponding to said first holding portion;

a second holding portion provided in said cleaning device, which holds a portion of said surface of said substrate corresponding to said groove portion; and a third holding portion provided in said carrying device, which holds said portion of said substrate corresponding to said groove portion.

2. A substrate cleaning system according to claim 1, wherein said first, second, and third holding portions each include a vacuum-creating portion.

3. A substrate cleaning system according to claim 1, wherein said substrate is a circular plate, and said cleaning portion cleans a portion of said circular plate corresponding to said first holding portion while said circular plate circumferentially rotates.

4. A substrate cleaning apparatus which cleans a substrate before setting said substrate on a substrate holding device having a first holding portion for holding said substrate and a groove portion that does not contact said substrate, said substrate cleaning apparatus comprising:

a cleaning portion which cleans a portion of a surface of said substrate corresponding to said first holding portion; and a second holding portion which holds a portion of said surface of said substrate corresponding to said groove portion.

5. A substrate cleaning apparatus according to claim 4, wherein said substrate is a circular plate, and said cleaning portion cleans a portion of said circular plate corresponding to said first holding portion while said circular plate circumferentially rotates.

6. A substrate cleaning apparatus according to claim 4, wherein said cleaning portion has an elastic member that causes a predetermined pressure to be applied to said portion of said substrate corresponding to said first holding portion.

7. A substrate cleaning apparatus according to claim 4, including a plurality of said cleaning portions and a plurality of said second holding portions, and wherein said substrate is a circular plate, and the cleaning portions and second holding portions are arranged alternately in a radial direction of said circular plate.

8. A system for handling a semiconductor substrate, comprising:

a cleaning device to clean said substrate, including a holding portion that contacts a first portion of a surface of said substrate to hold said substrate and a cleaning portion that cleans a second portion of said substrate surface;

a substrate holding device, which holds said substrate without contacting said first portion of said substrate surface, having a holding portion that contacts said second portion of said substrate surface; and a carrying device that transfers said substrate from said cleaning device to said substrate holding device, without contacting said second portion of said substrate surface, and having a holding portion that contacts said first portion of said substrate surface to hold said substrate.

9. A system according to claim 8, wherein said holding portions of said cleaning device, said substrate holding device, and said carrying device each include a vacuum-creating portion.

10. A system according to claim 8, wherein said substrate is a circular plate, and said cleaning portion cleans said second portion of said substrate surface while said circular plate circumferentially rotates.

11. A system according to claim 8, wherein said cleaning portion has an elastic member that causes a predetermined pressure to be applied to said second portion of said substrate surface.

12. A system according to claim 8, wherein said substrate is a circular plate, and said cleaning device includes a plurality of cleaning portions and a plurality of holding portions, said cleaning portions and said holding portions of said cleaning device being arranged alternately in a radial direction of said circular plate.

13. In a system for making an integrated circuit by forming a pattern on a semiconductor substrate:
- a cleaning device to clean said substrate, including a holding portion that contacts a first portion of a surface of said substrate to hold said substrate and a cleaning portion that cleans a second portion of said substrate surface;
- a substrate holding device, which holds said substrate without contacting said first portion of said substrate surface, and having a holding portion that contacts said second portion of said substrate surface; and
- a carrying device that transfers said substrate from said cleaning device to said substrate holding device, without contacting said second portion of said substrate surface, and having a holding portion that contacts said first portion of said substrate surface to hold said substrate.

14. A system according to claim 13, wherein said holding portions of said cleaning device, said substrate holding device, and said carrying device each include a vacuum-creating portion.

15. A system according to claim 13, wherein said substrate is a circular plate, and said cleaning portion cleans said second portion of said substrate surface while said circular plate circumferentially rotates.

16. A system according to claim 13, wherein said cleaning portion has an elastic member that causes a predetermined pressure to be applied to said second portion of said substrate surface.

17. A system according to claim 13, wherein said substrate is a circular plate, and said cleaning device includes a plurality of cleaning portions and a plurality of holding portions, said cleaning portions and said holding portions of said cleaning device being arranged alternately in a radial direction of said circular plate.

\* \* \* \* \*